(12) United States Patent
Hsieh et al.

(10) Patent No.: US 10,718,791 B2
(45) Date of Patent: Jul. 21, 2020

(54) PROBE ASSEMBLY AND PROBE STRUCTURE THEREOF

(71) Applicant: CHUNGHWA PRECISION TEST TECH. CO., LTD., Taoyuan (TW)

(72) Inventors: Kai-Chieh Hsieh, Taoyuan (TW); Yuan-Chiang Teng, Taoyuan (TW); Jian-Wei Li, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 45 days.

(21) Appl. No.: 16/154,176

(22) Filed: Oct. 8, 2018

(65) Prior Publication Data
US 2019/0265275 A1 Aug. 29, 2019

(30) Foreign Application Priority Data
Feb. 26, 2018 (TW) .............................. 107106387 A

(51) Int. Cl.
*G01R 1/067* (2006.01)
*G01R 31/00* (2006.01)
*G01R 1/073* (2006.01)

(52) U.S. Cl.
CPC ..... *G01R 1/07342* (2013.01); *G01R 1/06727* (2013.01)

(58) Field of Classification Search
CPC ............ G01R 1/06727; G01R 1/06733; G01R 1/07342; G01R 31/2889
See application file for complete search history.

(56) References Cited

U.S. PATENT DOCUMENTS

| | | | | |
|---|---|---|---|---|
| 6,967,493 B2* | 11/2005 | Mori | ................... | G01R 1/06733 324/756.03 |
| 7,063,541 B2* | 6/2006 | Grube | ................ | G01R 1/06727 257/E23.021 |
| 2002/0155735 A1* | 10/2002 | Zhou | ................... | G01R 1/06711 439/66 |
| 2003/0132769 A1* | 7/2003 | Boll | ................... | G01R 1/06772 324/754.07 |

* cited by examiner

*Primary Examiner* — Minh N Tang
(74) *Attorney, Agent, or Firm* — Li & Cai Intellectual Property (USA) Office

(57) ABSTRACT

The present disclosure provides a probe assembly and a probe structure thereof. The probe structure includes a first base part, a second base part, a connecting part, and a contacting part. The first base part includes a first contacting segment and a first connecting segment. The first contacting segment includes a first abutting portion and a first side end portion connected to the first abutting portion. The second base part includes a second contacting segment, a second connecting segment, and a passive component disposed between the second contacting segment and the second connecting segment. The second contacting segment includes a second abutting portion and a second side end portion connected to the second abutting portion. The first connecting segment and the second connecting segment are connected to the connection part. The contacting portion is connected to the connection part.

11 Claims, 9 Drawing Sheets

PROBE ASSEMBLY AND PROBE STRUCTURE THEREOF

BACKGROUND

1. Technical Field

The instant disclosure relates to a probe assembly and a probe structure thereof, and in particular, to a probe assembly for a chip probe card and a probe structure thereof.

2. Description of Related Art

The method of manufacturing cantilever-type chip probe cards mainly includes artificially soldering the probes on the printed circuit board and using an adhesive such as an epoxy resin to fix the probes. For example, TW 1447397 patent entitled "probe card" includes fixing the probe (33) on the circuit board (34) by a fixing portion (36) containing epoxy resins.

However, after the epoxy resin is cured, the cantilever-type chip probe card becomes hard to maintain and repair. Specifically, when a probe is damaged, it cannot be replaced individually and the whole set of the cantilever-type chip probe must be replaced.

In addition, the soldering wires in the cantilever-type probe cards require dense wiring material for performing a fan-out process, and since the artificially soldering process requires a larger operation space, the transmission path in the product is too long and results in poor transmission quality. Furthermore, since the line diameter of the probe in the cantilever-type probe card in the existing art is relatively large, the lines must be stacked in the vertical direction in addition to being arranged in the transverse direction, thus increasing the difficulty of the probe arrangement.

Moreover, the structures of the cantilever-type probe card in the existing art have the disadvantages of long transmission path, uncontrollable resistance and poor transmission quality. In addition, the power resistance increases along with the frequency due to the inductance caused by the existence of the long transmission path and the narrow probe cross section, reducing the voltage and resulting in poor testing yield.

SUMMARY

The problem to be solved of the instant disclosure is to provide a probe component and a probe structure thereof in which the probe component can effectively solve the problem related to the maintenance and repair of the cantilever-type probe and can improve the transmission quality while reducing the maintenance cost. In addition, the adverse effect resulted from the inductance in the transmission path of the probe structure can be reduced.

In order to solve the problems above, one of the embodiments of the instant disclosure provides a probe structure including a first base part, a second base part, a connecting part and a contacting part. The first base part includes a first contacting segment and a first connecting segment connected to the first contacting segment, in which the first contacting segment has a first abutting portion and a first side end connected to the first abutting portion. The second base part includes a second contacting segment, a second connecting segment and a passive component connected between the second contacting segment and the second connecting segment, in which the second contacting segment has a second abutting portion and a second side end connected to the second abutting portion. The first connecting segment of the first base portion and the second connecting segment of the second base portion are connected to the connecting part. The contacting part is connected to the connecting part.

Another embodiment of the instant disclosure provides a probe component including a substrate, a first plate and a probe structure. The substrate has a plurality of conductive structures. The first plate has a plurality of first through holes and a plurality of abutting parts. Each of the abutting parts is adjacent to one of the first through holes corresponding thereto, and each of the first through holes has a first aperture. The probe structure includes a first base part, a second base part, a connecting part and a contacting part, in which the first base part includes a first contacting segment and a connecting segment connected to the first contacting segment. The first contacting segment has a first abutting portion and a first side end connected to the first abutting portion. The second base part includes a second contacting segment, a second connecting segment and a passive component electrically connected between the second contacting segment and the second connecting segment. The second contacting segment has a second abutting portion and a second side end connected to the second abutting portion. The first connecting segment of the first base part and the second connecting segment of the second base are connected to the connecting part, in which the contacting part is connected to the connecting part. A maximum outer diameter of the first contacting segment is smaller than the first aperture of the first through hole and a maximum outer diameter of the second contacting segment is smaller than the first aperture of the first through hole for enabling the first contacting segment and the second contacting segment to pass through the first through hole. The first contacting segment is electrically connected to one of the plurality of conductive structures, and the second contacting segment is electrically connected to another one of the plurality of conductive structures. The first abutting portion and the second abutting portion respectively abut against two of the abutting parts corresponding thereto.

An advantage of the instant disclosure resides in that the probe component and the probe structure thereof provided by the instant disclosure can reduce the adverse effect caused by the inductance in the transmission path of the probe structure based on the technical feature of "the second base part includes a second contacting segment, a second connecting segment and a passive component electrically connected between the second contacting segment and the second connecting segment".

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
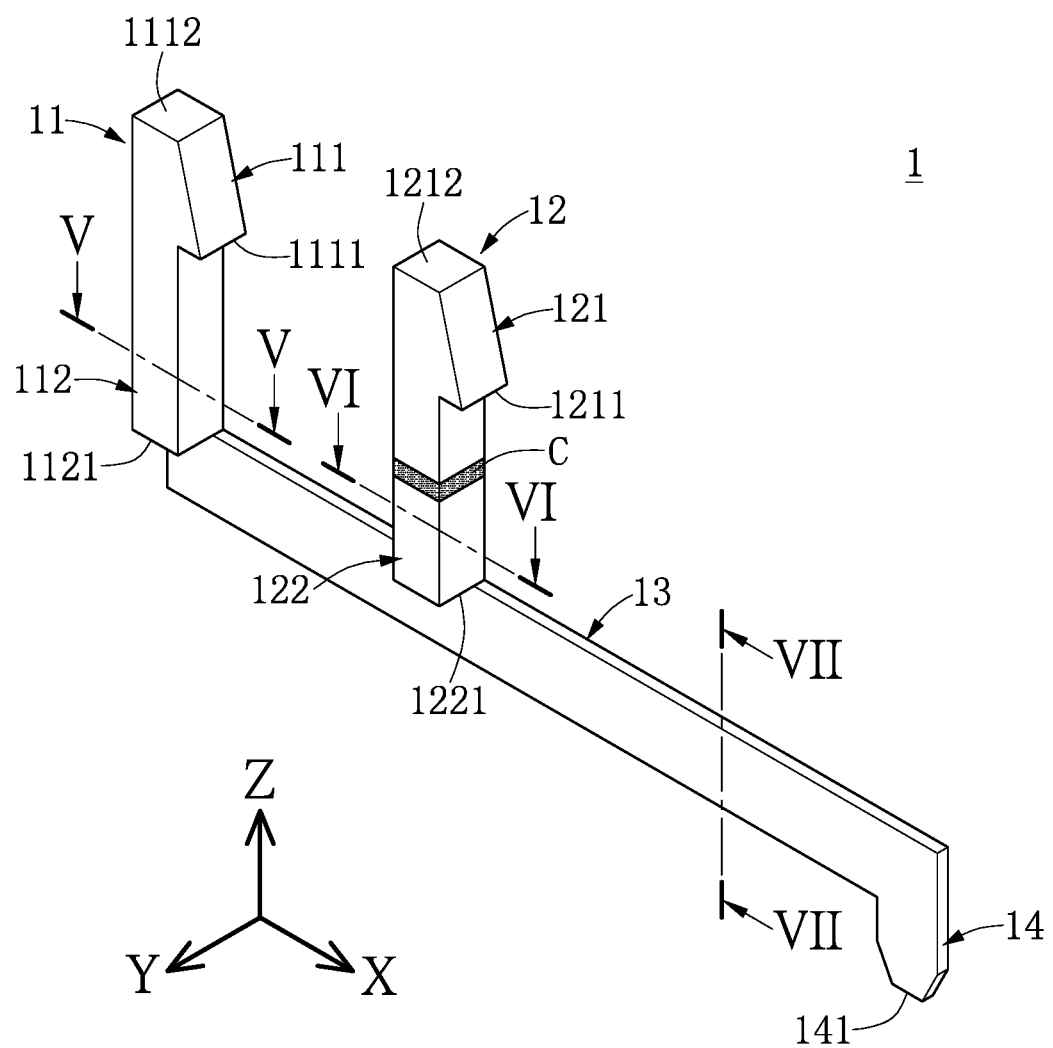
FIG. 1 is a three-dimensional schematic view of a probe structure of a first embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

It is noted that the term "first" and "second" for describing different elements or signals are only used to distinguish these elements/signals from one another rather than limiting the nature thereof. In addition, the term "or" used in the specification may include one or more of the listed items.

First Embodiment

Figure 2:
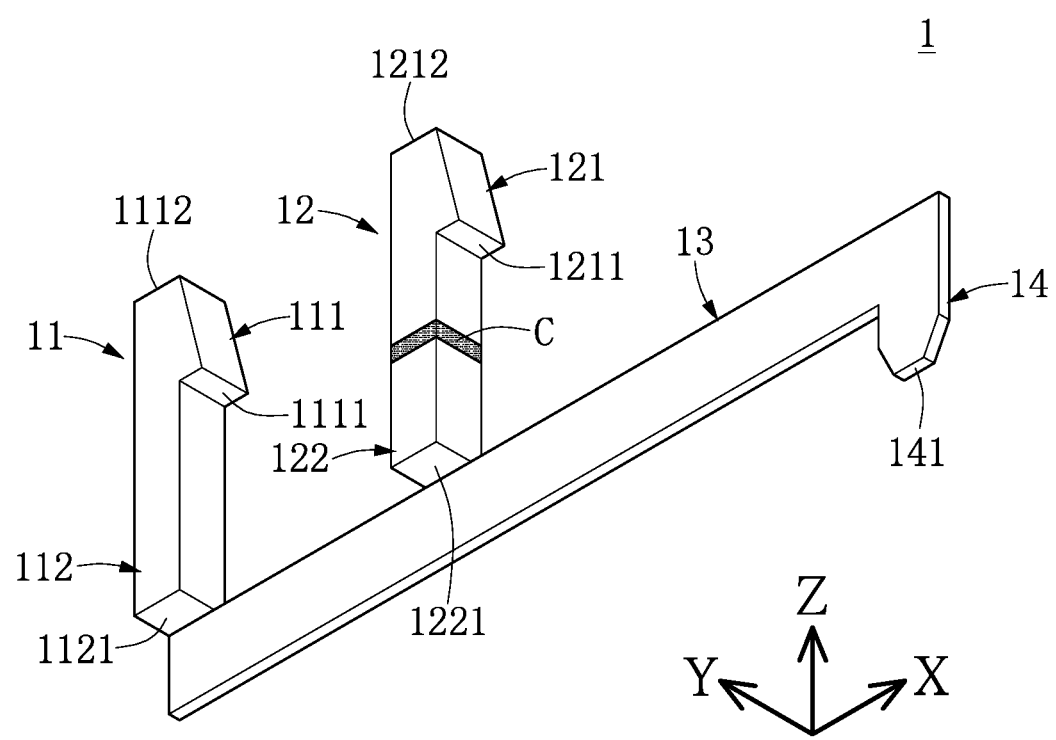
FIG. 2 is another three-dimensional schematic view of the probe structure of the first embodiment of the instant disclosure.
Figure 3:
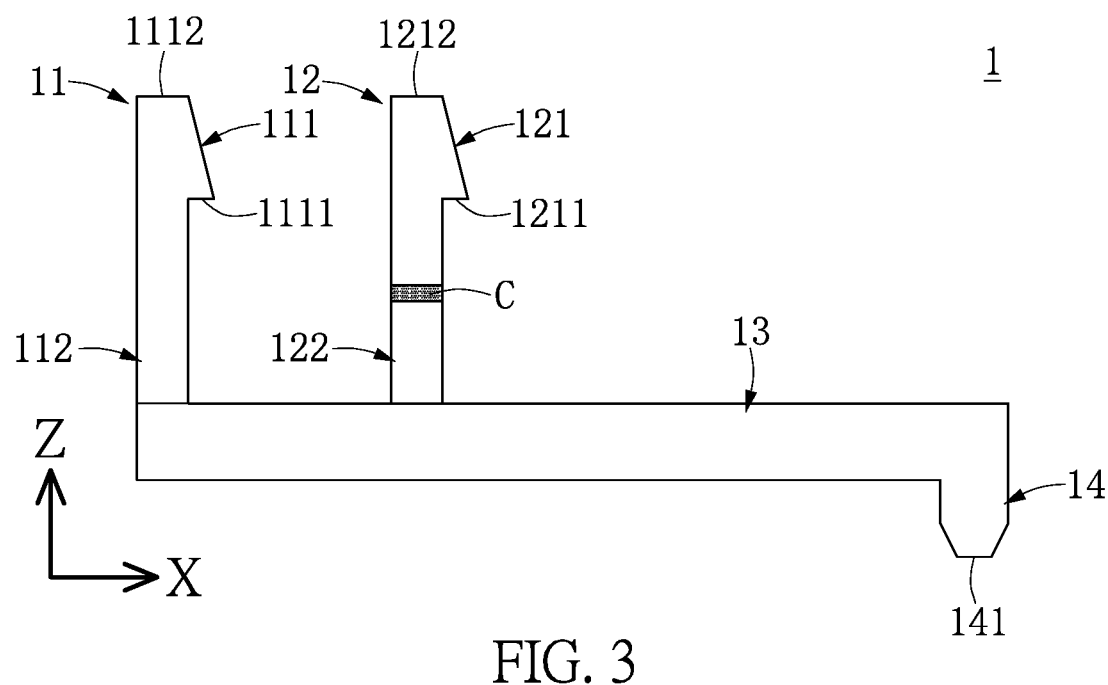
FIG. 3 is a side schematic view of the probe structure of the first embodiment of the instant disclosure.
Figure 4:
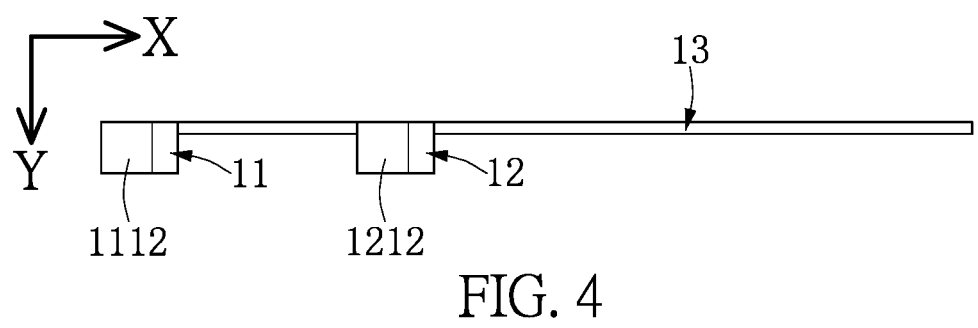
FIG. 4 is a top schematic view of the probe structure of the first embodiment of the instant disclosure.
Figure 12:
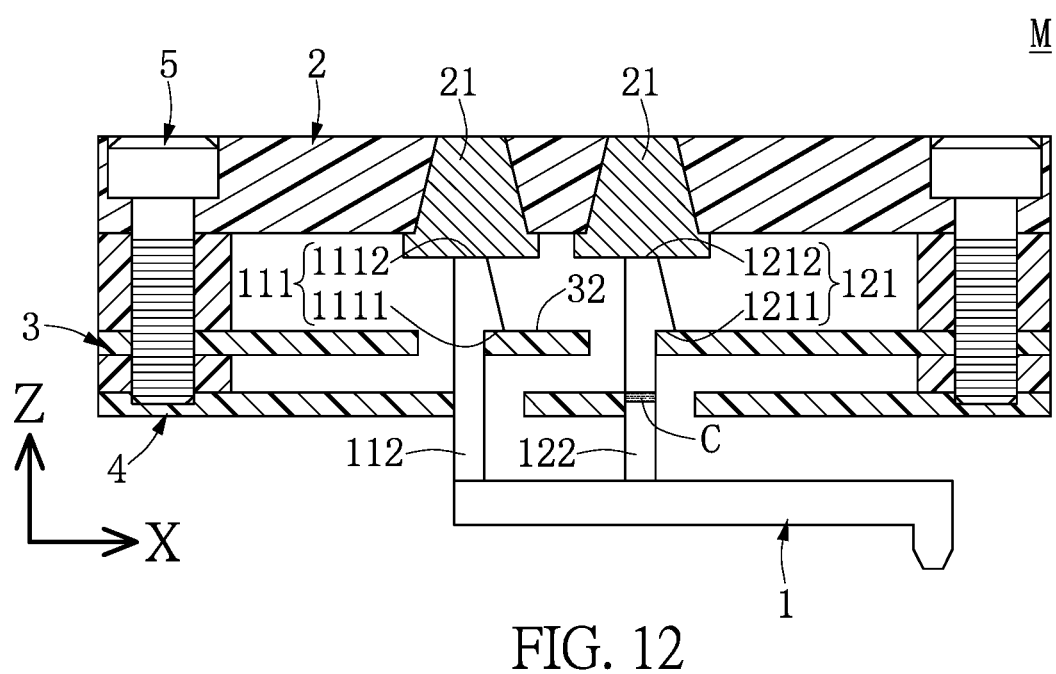
FIG. 12 is yet another side schematic view of the probe component of the second embodiment of the instant disclosure.

Reference is made to FIG. 1 to FIG. 4 and FIG. 12. FIG. 1 is a three-dimensional schematic view of a probe structure of a first embodiment of the instant disclosure, FIG. 2 is another three-dimensional schematic view of the probe structure of the first embodiment of the instant disclosure, FIG. 3 is a side schematic view of the probe structure of the first embodiment of the instant disclosure, FIG. 4 is a top schematic view of the probe structure of the first embodiment of the instant disclosure, and FIG. 12 is a side schematic view of the probe component of a second embodiment of the instant disclosure. The instant disclosure provides a probe component M and a probe structure 1 thereof. The main technical feature of the probe structure 1 is described in the first embodiment, and the main technical feature of the probe component M will be described in the second embodiment.

As shown in FIG. 1, the probe structure 1 can include a first base part 11, a second base part 12, a connecting part 13 and a contacting part 14. The first base part 11 can include a first contacting segment 111 and a first connecting segment 112 connected to the first contacting segment 111. The second base part 12 can include a second contacting segment 121, a second connecting segment 122 and a passive component C connected between the second connecting segment 122 and the second contacting segment 121. The first connecting segment 112 of the first base part 11 and the second connecting segment 122 of the second base part 12 can be connected to the connecting part 13. In addition, the contacting part 14 can be connected to the connecting part 13. Preferably, the distance between the second base part 12 and the contacting part 14 is smaller than the distance between the first base part 11 and the contacting part 14. Furthermore, in the embodiments of the instant disclosure, the probe structure 1 is a cantilever-type probe structure 1.

As shown in FIG. 1 and FIG. 2, the first contacting segment 111 can have a first abutting portion 1111 and a first side end 1112 connected to the first abutting portion 1111. The second contacting segment 121 can have a second abutting portion 1211 and a second side end 1212 connected to the second abutting portion 1211, and the contacting part 14 can have a contacting tip end 141. In the embodiments of the instant disclosure, the first contacting segment 111 and the second contacting segment 121 can be the needle tails of the probe structure 1 which are used to contact with the contacting end (such as the conductive structure 21 shown in FIG. 12) of a transfer board (such as the substrate 2 shown in FIG. 12). In addition, the contacting tip end 141 of the contacting part 14 of the probe structure 1 can be needle-like for breaking the oxidation layer on the surface of the tin ball of the object to be measured. However, in other implementations, the contacting tip end 141 of the probe structure 1 can be a flat surface. The instant disclosure is not limited thereto.

Reference is made to FIG. 1 to FIG. 3. Preferably, in the embodiments of the instant disclosure, the passive component C can be a capacitor. For example, the passive component C can be a multi-layer ceramic capacitor or a plane-parallel capacitor. However, the instant disclosure is not limited thereto. In addition, the passive component C can be inserted into a location between the second contacting segment 121 and the second connecting segment 122 of the second base part 12 by a microelectromechanical system (MEMS). Furthermore, the first base part 11 and the second base part 12 can be used to respectively receive different signals, and the signals can be fed into the object to be measured. Therefore, by the resonance point of the passive component C, the power resistances of different frequencies can be adjusted, thereby preventing the reduction of the voltage of the power signal. For example, when the transmission path to the object to be measured is relatively small, the inductance in the path becomes smaller and a capacitor with smaller capacitance can be used. In addition, in the case of small transmission path, the corresponding resonance point is located at a higher frequency range and can inhibit the power inductance at a higher frequency range. Therefore, such a design can be applied in testing projects in a higher frequency range and meet the requirements in the future. Furthermore, based on the arrangement of the passive component C, power can be supplied to the object to be measured by the passive component C nearby, thereby preventing the power from being affected by the inductance in the path and improving the power integrity (PI).

As shown in FIG. 1 to FIG. 3, the extension direction of the first contacting segment 111 (Z direction) and the extension direction of the contacting part 14 (negative Z direction) are different, and the extension direction of the second contacting segment 121 (Z direction) and the extension direction of the contacting part 14 (negative Z direction) are different. For example, as shown in FIG. 3, the extension direction of the first contacting segment 111 and the extension direction of the contacting part 14 are substantially opposite and parallel to each other. In addition, the extension direction of the second contacting segment 121 and the extension direction of the contacting part 14 are substantially opposite and parallel to each other. In other words, the first contacting segment 111, the first connecting segment 112, the second contacting segment 121 and the second connecting segment 122 can extend towards a first direction (Z direction), the connecting part 13 can extend towards a second direction (X direction), and the first direction and the second direction are different. In the embodiments of the instant disclosure, the first direction can be substantially perpendicular to the second direction. In addition, the contacting part 14 can extend towards a third direction (negative Z direction), and the third direction can be different from the second direction. In the embodiments of the instant disclosure, the third direction can be substantially perpendicular to the second direction.

Figure 5:
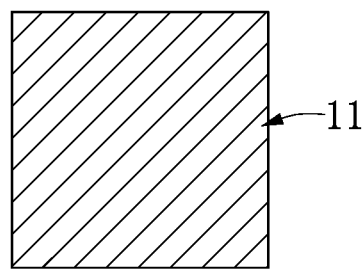
FIG. 5 is a side perspective schematic view taken along line V-V in FIG. 1.
Figure 6:
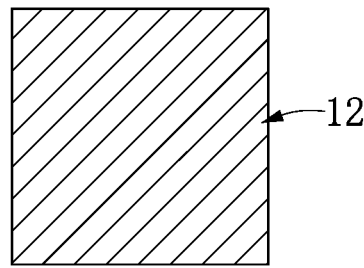
FIG. 6 is a side perspective schematic view taken along line VI-VI in FIG. 1.
Figure 7:
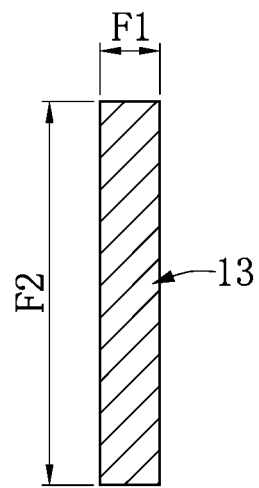
FIG. 7 is a side perspective schematic view taken along line VII-VII in FIG. 1.

Reference is made to FIG. 5 to FIG. 7. FIG. 5 is a side perspective schematic view taken along line V-V in FIG. 1, FIG. 6 is a side perspective schematic view taken along line VI-VI in FIG. 1, and FIG. 7 is a side perspective schematic view taken along line VII-VII in FIG. 1. In the embodiments of the instant disclosure, the cross section of the first connecting segment 112 is perpendicular to the extension direction of the first connecting segment 112, the cross section of the second connecting segment 122 is perpendicular to the extension direction of the second connecting segment 122, and the cross section of the connecting part 13 is perpendicular to the extension direction of the connecting part 13. Specifically, the shape of the cross section of the first connecting segment 112 and the shape of the cross section of the connecting part 13 are different, and the shape of the cross section of the second connecting segment 122 and the shape of the cross section of the connecting part 13 are different. Preferably, the area of the cross section of the first connecting segment 112 is larger than the area of the cross section of the connecting part 13, and the area of the cross section of the second connecting segment 122 is larger than the area of the cross section of the connecting part 13.

Preferably, as shown in FIG. 5 and FIG. 7, the cross sections of the first connecting segment 112 and the second connecting segment 122 can have a rectangular shape. For example, the first connecting segment 112 and the second connecting segment 122 each are a column structure. The cross section of the connecting part 13 and/or the contacting part 14 can have a rectangular shape narrower than that of the cross section of the first connecting segment 112 and the second connecting segment 122. For example, the connecting part 13 and the contacting part 14 are sheet-like structures (thin films). The column structure is different from the sheet structure. In addition, in the embodiments of the instant disclosure, the probe structure 1 is preferably manufactured by microelectromechanical systems (MEMS). In other words, the rectangular probe structure 1 in the present embodiment employs a manufacturing process different from that of a round probe.

Reference is made to FIG. 1 and FIG. 2. The first connecting segment 112 of the first base part 11 is connected to the connecting part 13 and the second connecting segment 122 of the second base part 12 is connected to the connecting part 13. Therefore, a first exposed surface 1121 can be formed by the first connecting segment 112 relative to the connecting part 13, and a second exposed surface 1221 can be formed by the second connecting segment 122 relative to the connecting part 13. Specifically, since the cross section of the first connecting segment 112 and the cross section of the second connecting segment 122 can have different shapes and sizes relative to that of the cross section of the connecting part 13, the first connecting segment 112 and the second connecting segment 122 can be formed with a first exposed surface 1121 and a second exposed surface 1221 exposed from the connecting part 13 respectively. Therefore, a step difference can be formed between the first connecting segment 112 and the connecting part 13, and a step difference can be formed between the second connecting segment 122 and the connecting part 13, and hence, the first connecting segment 112 and the second connecting segment 122 can be arranged discontinuously relative to the connecting part 13. Furthermore, the first connecting segment 112 and the connecting part 13 have a turning section therebetween, and the turning section can have a first exposed surface 1121. In addition, the second connecting segment 122 and the connecting part 13 have a turning section therebetween, and the turning section can have a second exposed surface 1221.

As shown in FIG. 7, the connecting part 13 can have a first side edge (not numbered) and a second side edge (not numbered) on any cross section of the connecting part 13. The first side edge can have a first width F1, the second side edge can have a second width F2, and the size of the first width F1 is smaller than that of the second width F2. In other words, the sheet structure can have a first width F1 and a second width F2, and the size of the first width F1 is smaller than that of the second width F2. Preferably, the ratio between the first width F1 and the second width F2 can be from 0.2 to 0.5. For example, the first width F1 can be 0.1 millimeters (mm), and the second width F2 can be from 2 to 5 millimeters. However, the instant disclosure is not limited thereto. Furthermore, the contacting part 14 receives a force having a Z direction, and the length direction (extension direction) of the second side edge extends along and towards the third direction (negative Z direction). Since the connecting part 13 contacts the first connecting segment 112 and the second connecting segment 122 through the first side edge having a smaller size, although the first width F1 is smaller than the second width F2, the force for abutting against the contacting tip end 141 of the contacting part 14 against the object to be measured can be maintained.

Referring to FIG. 1 and FIG. 2, although the first abutting portion 1111 of the first contacting segment 111 and the second abutting portion 1211 of the second contacting segment 121 shown in the figures have reverse-hook shapes, in other embodiments, the shapes of the first abutting portion 1111 and the second abutting portion 1211 can be concave shape. The instant disclosure is not limited thereto. Moreover, in other embodiments, the probe structure 1 can have a plurality of first abutting portions 1111 and/or a plurality of second abutting portions 1211. The instant disclosure is not limited thereto.

Figure 8:
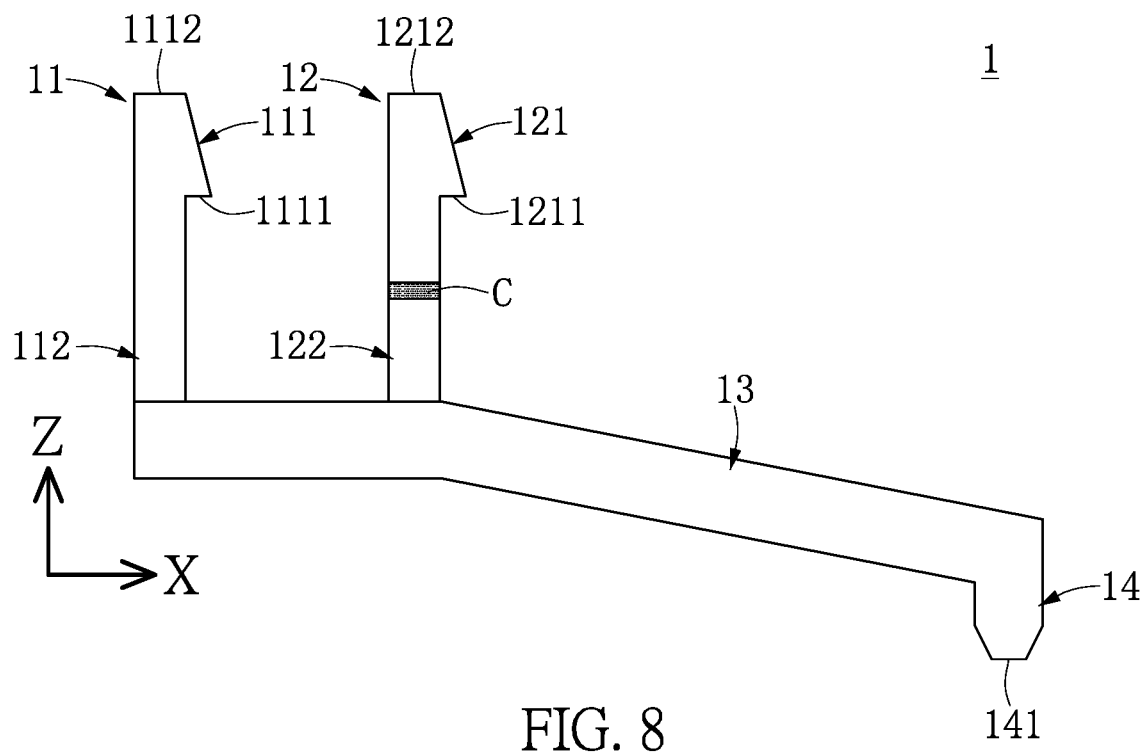
FIG. 8 is a side perspective schematic view of another implementation of the probe structure of the first embodiment of the instant disclosure.
Figure 9:
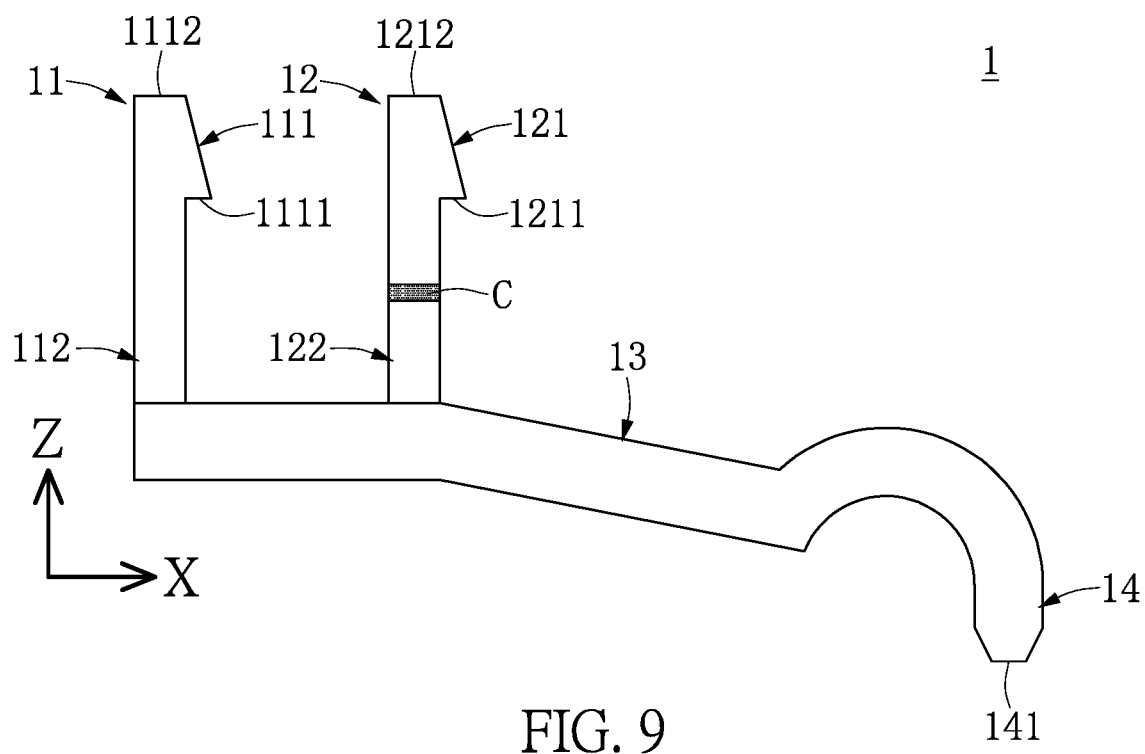
FIG. 9 is a side perspective schematic view of yet another implementation of the probe structure of the first embodiment of the instant disclosure.

Reference is made to FIG. 8 and FIG. 9. FIG. 8 and FIG. 9 are side perspective schematic views of other implementations of the probe structure of the first embodiment of the instant disclosure. Specifically, in other implementations, the shape of the probe structure 1 can be adjusted. For example, in the implementations shown in FIG. 8 and FIG.

9, the shapes of the connecting part 13 and the contacting part 14 of the probe structure 1 are adjusted for applying to different objects to be measured. It should be noted that the shapes of the connecting part 13 and the contacting part 14 are not limited in the instant disclosure.

Second Embodiment

Figure 10:
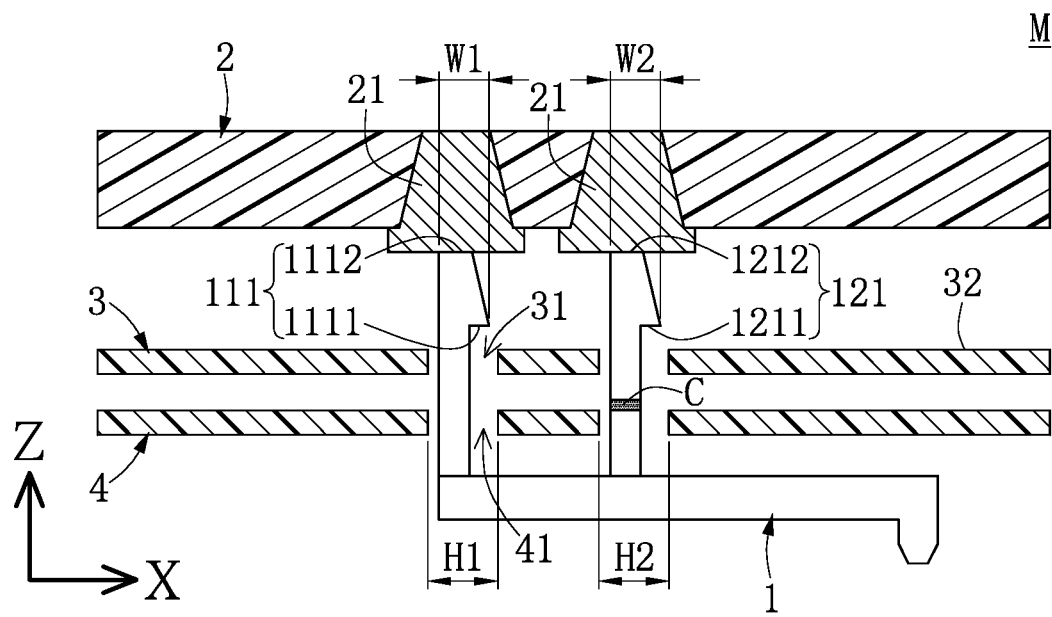
FIG. 10 is a side schematic view of the probe component of a second embodiment of the instant disclosure.
Figure 11:
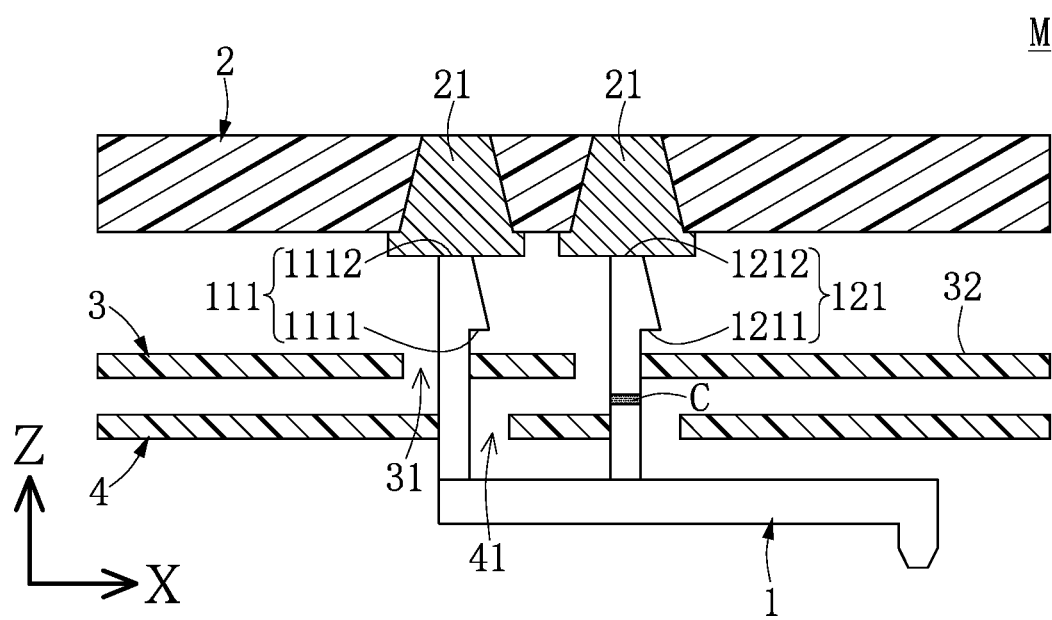
FIG. 11 is another side schematic view of the probe component of the second embodiment of the instant disclosure.

Reference is made to FIG. 10 to FIG. 12. FIG. 10 to FIG. 12 are side schematic views of the probe component M of a second embodiment of the instant disclosure during the assembly process. It should be noted that only a part of the probe component M is shown in the figures for illustrating the embodiment, and some parts are omitted to show the details of the structure of the probe component M. Specifically, only one probe structure 1 is illustrated in FIG. 10 to FIG. 12. In addition, the structure of the probe structure 1 provided in the second embodiment is similar to that of the previous embodiment and is not reiterated herein. Therefore, reference is made to FIG. 1 and FIG. 2 if needed.

As shown in FIG. 10, the second embodiment of the instant disclosure provides a probe component M including a substrate 2, a first plate 3 and a probe structure 1. The substrate 2 can have a plurality of conductive structures 21. For example, the substrate 2 can be a transfer board or a space transformer (ST) for testing a chip. In addition, in other embodiments, the substrate 2 can be a printed circuit board. Since the probe structure 1 can be manufactured by microelectromechanical systems, it has smaller size and does not need the use of a space transformer. The probe structure 1 can be directly disposed on the printed circuit board for enabling the probe structure 1 to be electrically connected to the conductive structure 21 of the printed circuit board.

As shown in FIG. 10, the first plate 3 can have a plurality of first through holes 31 and a plurality of abutting parts 32, and each of the abutting parts 32 can be disposed adjacent to a first through hole 31 corresponding thereto. Each of the first through holes 31 has a first aperture H1. In addition, preferably, in the embodiments of the instant disclosure, the probe component M can further include a second plate 4 having a plurality of second through holes 41. For example, the second plate 4 can be disposed substantially parallel to the first plate 3, and the locations of the plurality of second through holes 41 correspond to the locations of the plurality of first through holes 31. Each of the second through holes 41 has a second aperture H2.

Referring to FIG. 10, FIG. 1 and FIG. 2, the probe structure 1 can include a first base part 11, a second base part 12, a connecting part 13 and a contacting part 14. The first base part 11 can include a first contacting segment 111 and a first connecting segment 112 connected to the first contacting segment 111. The second base part 12 can include a second contacting segment 121, a second connecting segment 122 and a passive component C electrically connected between the second contacting segment 121 and the second connecting segment 122. The first connecting segment 112 of the first base part 11 and the second connecting segment 122 of the second base part 12 can be connected to the connecting part 13. The contacting part 14 can be connected to the connecting part 13. In addition, the first contacting segment 111 can have a first abutting portion 1111 and a first side end 1112 connected to the first abutting portion 1111. The second contacting segment 121 can have a second abutting portion 1211 and a second side end 1212 connected to the second abutting portion 1211. The contacting part 14 can have a contacting tip end 141. It should be noted that the structure of the probe structure 1 provided in the second embodiment is similar to that of the previous embodiment and is not reiterated herein.

As shown in FIG. 10, a maximum outer diameter W1 of the first contacting segment 111 can be smaller than the first aperture H1 of the first through hole 31 and a maximum outer diameter W2 of the second contacting segment 121 can be smaller than the first aperture H1 of the first through hole 31. Therefore, the first contacting segment 111 and the second contacting segment 121 can pass through the first through hole 31. In addition, a maximum outer diameter W1 of the first contacting segment 111 can be smaller than the second aperture H2 of the second through hole 41 and a maximum outer diameter W2 of the second contacting segment 121 can be smaller than the second aperture H2 of the second through hole 41. Therefore, the first contacting segment 111 and the second contacting segment 121 can pass through the second through hole 41. Moreover, the first contacting segment 111 can be electrically connected to one of the plurality of conductive structures 21, and the second contacting segment 121 can be electrically connected to another one of the plurality of conductive structures 21.

Reference is made to FIG. 11. The first plate 3 and the second plate 4 can be dislocated from each other by changing the relative position between the first plate 3 and the second plate 4 by a user. Specifically, the first plate 3 can be moved towards the X direction, and the second plate 4 can be moved towards the negative X direction. Therefore, the first abutting portion 1111 and the second abutting portion 1211 of the probe structure 1 can respectively abut against the corresponding first through hole 31 for locating the probe structure 1.

As shown in FIG. 12, the probe component M can preferably further include a fixing member 5. For example, the fixing member 5 can be a screw, but the instant disclosure is not limited thereto. The fixing member 5 can be disposed on the substrate 2, the first plate 3 and the second plate 4 for enabling the first abutting portion 1111 and the second abutting portion 1211 of the probe structure 1 to respectively abut against the corresponding abutting part 32 for locating the probe structure 1. In other words, the fixing member 5 can be used to determine the relative position between the probe structure 1 and the substrate 2, the first plate 3 and the second plate 4. In addition, it should be noted that since the probe structure 1 abuts against the corresponding abutting parts 32 through the first abutting portion 1111 and the second abutting portion 1211 respectively, the fixing member 5 is used to locate the probe structure 1. Therefore, when one of the probe structures 1 is damaged, the damaged probe structure 1 can be replaced by moving the first plate 3 and the second plate 4.

It should be noted that since the cross sections of the first connecting segment 112 and the second connecting segment 122 can have a rectangular shape, the cross section of the connecting part 13 can have a rectangular shape which is narrower than that of the first connecting segment 112 and the second connecting segment 122. Therefore, after disposing the second plate 4 and after embedding the first contacting segment 111, the first connecting segment 112 (a part of the first connecting segment 112 of the entire first connecting segment 112), the second contacting segment 121 and the second connecting segment 122 (a part of the second connecting segment 122 or the entire second connecting segment 122) in a location between the second plate 4 and the substrate 2, two probe structures 1 can be prevented from being affected by the interference between the first base part 11 and the second base part 12.

Figure 13:
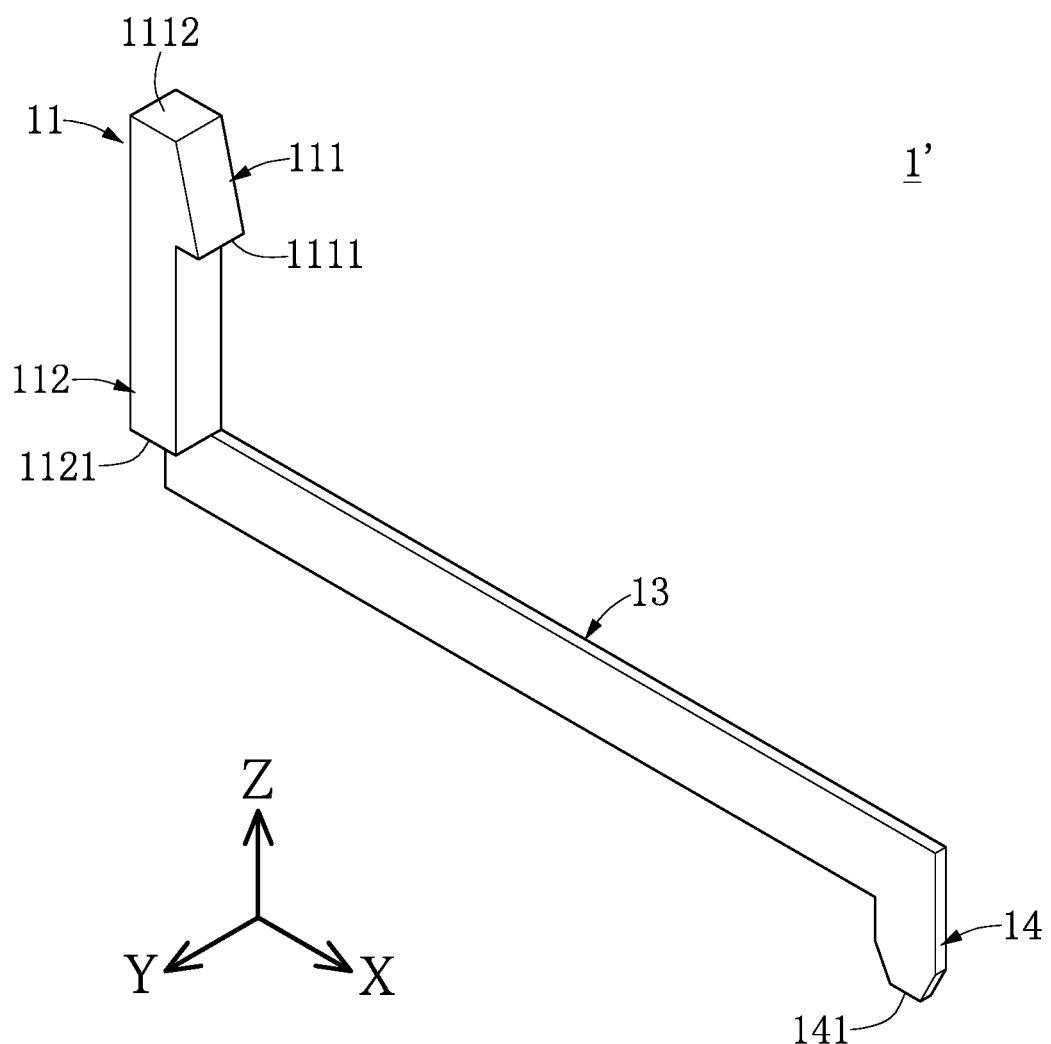
FIG. 13 is a three-dimensional schematic view of another implementation of the probe structure of an embodiment of the instant disclosure.
Figure 14:
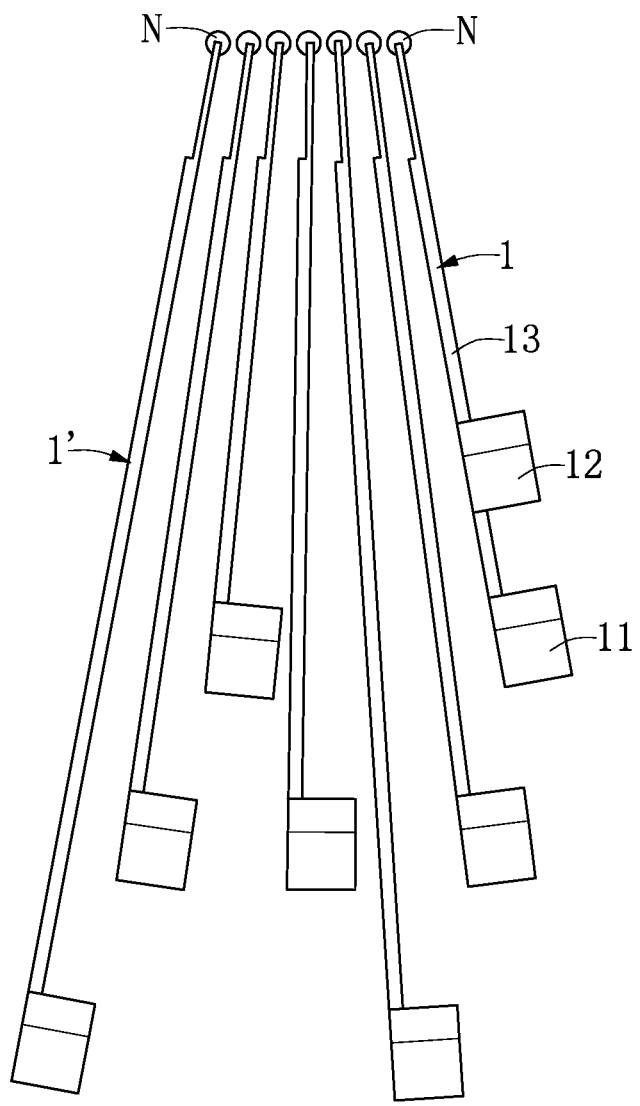
FIG. 14 a schematic view of the use state of the probe structure of an embodiment of the instant disclosure.

Reference is made to FIG. 13 and FIG. 14. FIG. 13 is a three-dimensional schematic view of another implementation of the probe structure of an embodiment of the instant disclosure, and FIG. 14 a schematic view of the use state of the probe structure of an embodiment of the instant disclosure. The main difference between the probe structure 1' of FIG. 13 and the probe structure 1 of FIG. 1 is that the probe structure 1 of FIG. 1 is mainly used to provide power, and the probe structure 1' of FIG. 13 is mainly used to provide signals. Therefore, the probe structure 1' of FIG. 13 does not include the second base part 12. In addition, it should be noted that the structure of the probe structure 1' of FIG. 13 is similar to that of the probe structure 1 of FIG. 1 without the second base part 12.

FIG. 14 is a top view of a plurality of probe structures (1, 1'). As shown in FIG. 14, the probe structures (1, 1') can be arranged based on the testing array of the probe card. In addition, the plurality of probe structures (1, 1') can have different structures. For example, at least two of the plurality of probe structures (1, 1') can have different lengths. In other words, the arranging angle of each of the probe structures (1, 1') can be adjusted based on actual needs. In addition, the contacting tip end 141 of the probe structure (1, 1') can be electrically connected to the contacting point of object to be measured N.

Effect of the Embodiments

One of the advantages of the instant disclosure resides in that the probe component M and the probe structure 1 thereof provided by the instant disclosure can reduce the adverse effect caused by the inductance in the transmission path of the probe structure 1 based on the technical feature of "the second base part 12 includes a second contacting segment 121, a second connecting segment 122 and a passive component C electrically connected between the second contacting segment 121 and the second connecting segment 122", thereby improving the power integrity.

In addition, based on the technical feature of "the first contacting segment 111 has a first abutting portion 1111" and "the second contacting segment 121 has a second abutting portion 1211", the probe structure 1 can be replaced individually, thereby providing a replaceable probe structure 1 and reducing the maintenance cost. Furthermore, compared to the existing cantilever-type probe structures, the probe structure 1 of the instant disclosure can reduce the transmission path (differ from the discontinuous transmission path of the existing cantilever-type probe structures), thereby improving the signal integrity (SI) of the transmission quality.

Moreover, since the probe structure 1 provided by the embodiments of the instant disclosure is a cantilever-type probe structure, it has needle points that points outwardly, the probe structure 1 can be fixed on the substrate 2 by multiple sets of different first plate 3, second plate 4 and fixing member 5. Specifically, probe structures 1 having different lengths can be used for reducing the difficulty of the manufacture of the fine pitch. In addition, since the cross sections of the connecting part 13 and/or contacting part 14 can have rectangular shapes—the first connecting segment 112 and the second connecting segment 122 are column structures and the connecting part 13 is a sheet structure, and the column structure is different from the sheet structure— the requirement of the fine pitch can be met, and the structure can provide required supporting force.

Specifically, the first abutting portion 1111 and the second abutting portion 1211 of the probe structure 1 can respectively abut against the corresponding abutting portions 32 of the first plate 3, and the probe structure 1 can be located on the substrate 2 for enabling the first contacting segment 111 and the second contacting segment 121 of the probe structure 1 to be electrically connected to the conductive structure 21 on the substrate 2.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A probe structure, comprising:
    a first base part including a first contacting segment and a first connecting segment connected to the first contacting segment, wherein the first contacting segment has a first abutting portion and a first side end connected to the first abutting portion;
    a second base part including a second contacting segment, a second connecting segment and a passive component connected between the second contacting segment and the second connecting segment, wherein the second contacting segment has a second abutting portion and a second side end connected to the second abutting portion;
    a connecting part, the first connecting segment of the first base portion and the second connecting segment of the second base portion being connected to the connecting part; and
    a contacting part connected to the connecting part;
    wherein a cross section of the first connecting segment is perpendicular to an extension direction of the first connecting segment, a cross section of the second connecting segment is perpendicular to an extension direction of the second connecting segment, and a cross section of the connecting part is perpendicular to an extension direction of the connecting part, wherein a shape of the cross section of the first connecting segment is different from that of the cross section of the connecting part, and the shape of the cross section of the second connecting segment is different from that of the cross section of the connecting part;
    wherein a first exposed surface is formed by the first connecting segment relative to the connecting part, and a second exposed surface is formed by the second connecting segment relative to the connecting part;
    wherein the first connecting segment and the connecting part have a turning section therebetween, and the turning section has the first exposed surface;
    wherein the second connecting segment and the connecting part have a turning section therebetween, and the turning section has the second exposed surface.

2. The probe structure according to claim 1, wherein an area of the cross section of the first connecting segment is larger than the area of the cross section of the connecting part, and the area of the cross section of the second connecting segment is larger than the area of the cross section of the connecting part.

3. The probe structure according to claim 1, wherein the probe structure is a cantilever type probe structure.

4. The probe structure according to claim 1, wherein an extension direction of the first contacting segment is different from an extension direction of the connecting part, and an extension direction of the second contacting segment is different from the extension direction of the connecting part.

5. The probe structure according to claim 1, wherein the first abutting portion and the second abutting portion are configured to respectively abut against an abutting part of a first plate.

6. The probe structure according to claim 1, wherein the first connecting segment and the second connecting segment each are a column structure, the connecting part is a sheet structure, and the column structure and the sheet structure have different shapes.

7. The probe structure according to claim 1, wherein the first contacting segment, the first connecting segment, the second contacting segment and the second connecting segment extend towards a first direction, the connecting part extends towards a second direction, and the first direction and the second direction are different.

8. The probe structure according to claim 1, wherein the passive component is a capacitor.

9. A probe component including:
a substrate having a plurality of conductive structures;
a first plate having a plurality of first through holes and a plurality of abutting parts, each of the abutting parts being adjacent to one of the first through holes corresponding thereto, each of the first through holes having a first aperture; and
a probe structure including a first base part, a second base part, a connecting part and a contacting part, wherein the first base part includes a first contacting segment and a connecting segment connected to the first contacting segment, the first contacting segment having a first abutting portion and a first side end connected to the first abutting portion, wherein the second base part includes a second contacting segment, a second connecting segment and a passive component electrically connected between the second contacting segment and the second connecting segment, the second contacting segment having a second abutting portion and a second side end connected to the second abutting portion, wherein the first connecting segment of the first base part and the second connecting segment of the second base part are connected to the connecting part, wherein the contacting part is connected to the connecting part;
wherein a maximum outer diameter of the first contacting segment is smaller than the first aperture of the first through hole, and a maximum outer diameter of the second contacting segment is smaller than the first aperture of the first through hole for enabling the first contacting segment and the second contacting segment to respectively pass through the first through hole corresponding thereto;
wherein the first contacting segment is electrically connected to one of the plurality of conductive structures, and the second contacting segment is electrically connected to another one of the plurality of conductive structures;
wherein the first abutting portion and the second abutting portion respectively abut against two of the abutting parts corresponding thereto;
wherein a cross section of the first connecting segment is perpendicular to an extension direction of the first connecting segment, a cross section of the second connecting segment is perpendicular to an extension direction of the second connecting segment, and a cross section of the connecting part is perpendicular to an extension direction of the connecting part, wherein a shape of the cross section of the first connecting segment is different from that of the cross section of the connecting part, and the shape of the cross section of the second connecting segment is different from that of the cross section of the connecting part;
wherein a first exposed surface is formed by the first connecting segment relative to the connecting part, and a second exposed surface is formed by the second connecting segment relative to the connecting part;
wherein the first connecting segment and the connecting part have a turning section therebetween, and the turning section has the first exposed surface;
wherein the second connecting segment and the connecting part have a turning section therebetween, and the turning section has the second exposed surface.

10. The probe component according to claim 9, further including: a second plate having a plurality of second through holes, the second plate being substantially parallel to the first plate, the plurality of second through holes respectively corresponding to the plurality of first through holes, and each of the second through holes has a second aperture.

11. The probe component according to claim 10, further including: a fixing member disposed on the substrate, the first plate and the second plate for enabling the first abutting portion and the second abutting portion of the probe structure to respectively abut against two of the abutting parts corresponding thereto.

* * * * *